(12) United States Patent
Tso et al.

(10) Patent No.: US 8,048,227 B2
(45) Date of Patent: Nov. 1, 2011

(54) COMPENSATION PLATE USED IN A FILM COATING DEVICE

(75) Inventors: Chih-Wei Tso, Taipei Hsien (TW); Po-Wen Chan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 861 days.

(21) Appl. No.: 12/108,015

(22) Filed: Apr. 23, 2008

(65) Prior Publication Data

US 2009/0090301 A1   Apr. 9, 2009

(30) Foreign Application Priority Data

Oct. 9, 2007   (CN) .......................... 2007 1 0201958

(51) Int. Cl.
*C23C 16/00* (2006.01)
*C23F 1/00* (2006.01)
*H01L 21/306* (2006.01)

(52) U.S. Cl. ...................... 118/720; 118/715; 156/345.3

(58) Field of Classification Search ................... 118/720, 118/721; 156/345.1, 345.11, 345.19, 345.3; 204/192.13, 298.11
See application file for complete search history.

(56) References Cited

U.S. PATENT DOCUMENTS

| | | | | |
|---|---|---|---|---|
| 2,888,227 | A * | 5/1959 | Tomlan et al. | 248/291.1 |
| 4,988,424 | A * | 1/1991 | Woodward et al. | 204/192.29 |
| 5,748,366 | A * | 5/1998 | Yasunaga et al. | 359/368 |
| 6,447,653 | B1 * | 9/2002 | Debley et al. | 204/192.13 |
| 2005/0184245 | A1 * | 8/2005 | Hove et al. | 250/370.09 |
| 2006/0196423 | A1 | 9/2006 | Huang | |

* cited by examiner

*Primary Examiner* — Maureen Gramaglia
*Assistant Examiner* — Tiffany Nuckols
(74) *Attorney, Agent, or Firm* — Altis Law Group, Inc.

(57) ABSTRACT

A compensation plate used in a film coating device includes a main body defining a plurality of guiding holes, a plurality of moveable blades connected to the main body, and a plurality of connectors. Each of the plurality of moveable blades defines two through holes corresponding to one of the plurality of guiding holes. The plurality of connectors engage in the through holes and the guiding holes, fix each of the plurality of moveable blades to the main body when each of the plurality of connectors is fastened, and slide in each of the plurality of guiding holes with each of the moveable blades when each of the plurality of connectors releases.

6 Claims, 4 Drawing Sheets

COMPENSATION PLATE USED IN A FILM COATING DEVICE

BACKGROUND

1. Field of the Invention

The present invention relates to a compensation plate used in a film coating device.

2. Description of Related Art

Referring to FIG. 4, a film coating device 200 includes film coating sources 10, compensation plates 11, and an umbrella-like canopy 12. Rings of substrates 13 are formed on a surface of the umbrella-like canopy 12 facing the film coating sources 10. Each film coating source 10 includes a heater 101 and raw material 102. The raw material 102 is heated and evaporated by the heater 101. The evaporated raw material 102 then travels to the substrates 13 and forms films thereon. Since distances and angles between the substrates 13 and the raw material 102 are not uniform, thickness of film deposited on the different substrates 13 may not be uniform. Therefore, to ensure uniformity of thickness for the films deposited on the different substrates 13, the compensation plates 11 are used.

Typically, manufacture of the compensation plates 11, begins with simulation in a personal computer, after which the compensation plate 11 is physically manufactured according to the simulation, and is tested in the film coating device 200 to qualify the compensation plate 11. If the compensation plate 11 does not pass qualification, another compensation plate 11 is produced and tested, until the compensation plate 11 is made that qualifies. Therefore, efficiency of manufacturing the typical compensation plate 11 is low, and material is wasted, which results in high manufacturing cost.

What is need, therefore, is to provide a compensation plate used in a film coating device, in which the above problems are eliminated or at least alleviated

SUMMARY

The present invention relates to a compensation plate used in a film coating device. The compensation plate includes a main body defining a plurality of guiding holes, a plurality of moveable blades connected to the main body, and a plurality of connectors. Each of the plurality of moveable blades defines two through holes corresponding to one of the plurality of guiding holes. The plurality of connectors engage in the through holes and the guiding holes, fix each of the plurality of moveable blades to the main body when each of the plurality of connectors is fastened, and slide in each of the plurality of guiding holes with each of the moveable blades when each of the plurality of connectors releases.

Other advantages and novel features of the present invention will become more apparent from the following detailed description of present embodiments when taken in conjunction with the accompanying drawings.

DETAILED DESCRIPTION OF THE EMBODIMENTS

Reference will now be made to the figures to describe at least one exemplary embodiment in detail.

Figure 1:
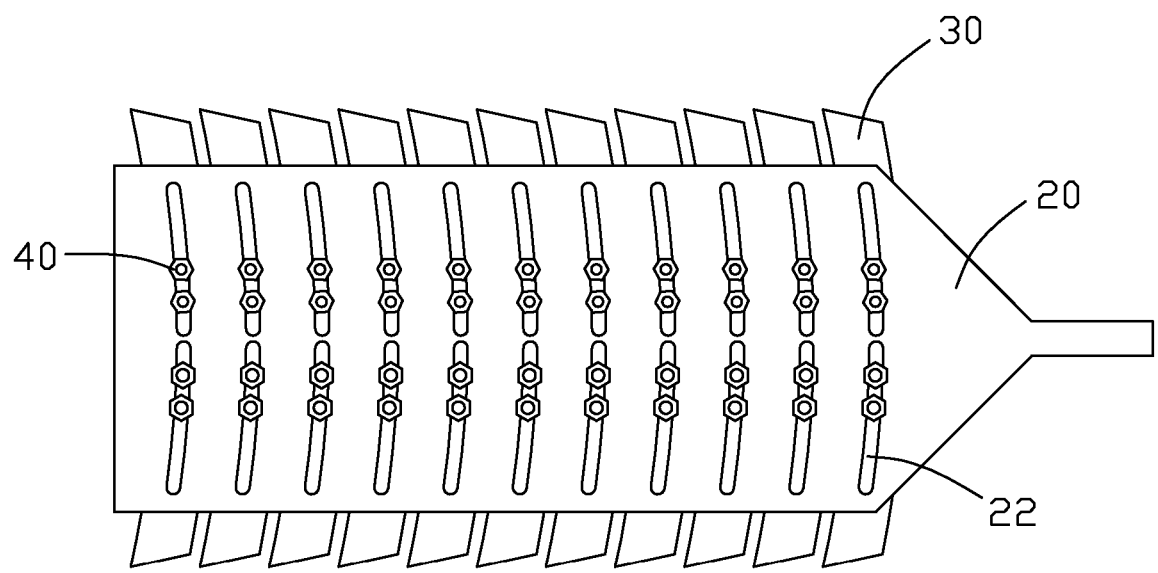
FIG. 1 is a bottom view of a compensation plate according to an exemplary embodiment.
Figure 2:
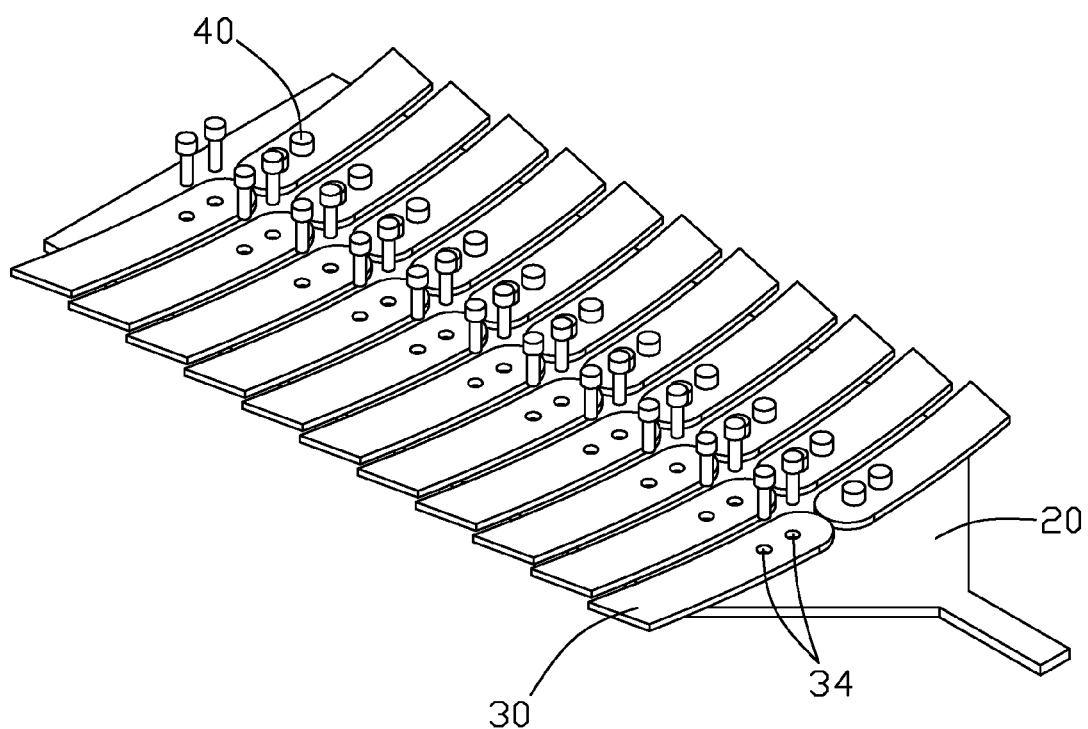
FIG. 2 is a partially disassembled isometric top view of the compensation plate of FIG. 1.

Referring to FIGS. 1 and 2, a compensation plate 100 used in a film coating device, in accordance with an exemplary embodiment, is shown. The compensation plate 100 includes a main body 20, a plurality of moveable blades 30, and a plurality of connectors 40. The moveable blades 30 may be arranged in two rows in the embodiment. Each moveable blade 30 may be connected to the main body 20 via two connectors 40. The main body 20 may be made of a material such as a stainless steel, iron, or aluminum, and the moveable blades 30 may be made of a material such as a stainless steel, iron, or aluminum.

Figure 4:
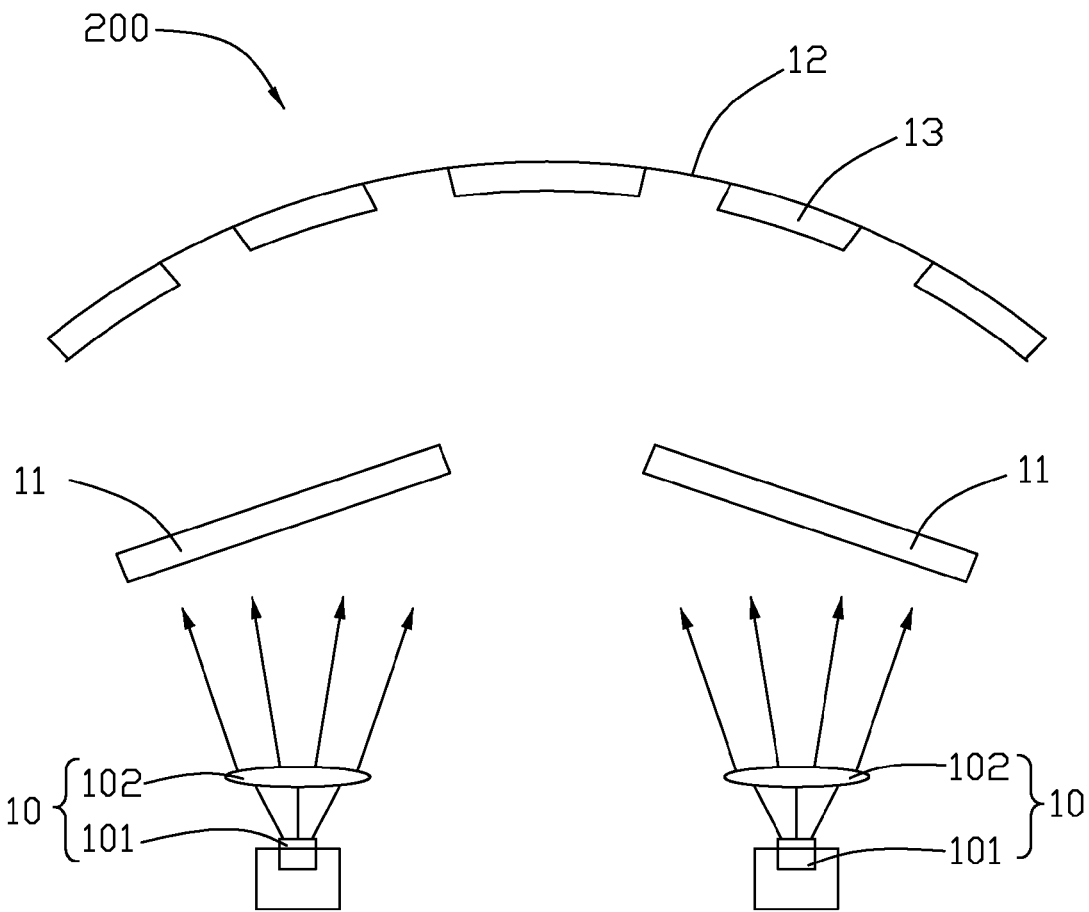
FIG. 4 is a schematic view of a film coating device using a typical compensation plate.

A plurality of guiding holes 22 is defined in the main body 20 corresponding to the plurality of moveable blades 30, respectively. Each guiding hole 22 may be arc-shaped, and may have curvature approximately equivalent to curvature of the corresponding moveable blade 30 and curvature of a travel track of the substrates 13 on the umbrella-like canopy 12 (see FIG. 4).

Each moveable blade 30 may have an arc-shaped profile. Two through holes 34 are defined in each moveable blade 30 corresponding to the guiding hole 22 for insertion of two connectors 40.

Figure 3:
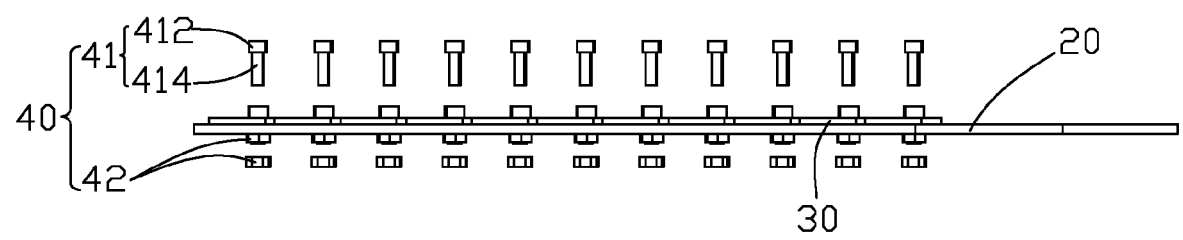
FIG. 3 is a side view of the compensation plate of FIG. 2.

In this embodiment, referring to FIG. 3, each connector 40 may include a bolt 41 and a nut 42. The bolt 41 comprises a head 412 and a post 414 extending from the head 412. The post 414 of the bolt 41 may pass through the corresponding through hole 34 and the guiding hole 22, and may be screwed into the nut 42 to fix the corresponding blade 30 to the main body 20. Under these conditions, the blade 30 is secured to the main body 20. The post 414 may be adjustably positioned in the corresponding guiding hole 22. Loosening of the bolts 41 allows repositioning of the posts 414 in the guiding holes 22, and tightening of the bolts 41 fixes them in a new position. Therefore, a location of the blade 30 relative to the main body 20 can be adjusted according to actual requirements.

The bolt 41 may be formed integrally with, and extending from, a side of the moveable blade 30. In other embodiments, the nut 42 may be omitted, and the through holes 34 may then be threaded internally for fixedly receiving the posts 414 of the bolts 41.

When the compensation plate 100 is finished, it may be tested, and the moveable blades 30 may be repositioned iteratively if necessary until the compensation plate 100 passes qualification.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A compensation plate used in a film coating device, the compensation plate comprising:

an elongated main body defining a plurality of curved guiding slots, the guiding slots arranged in pairs, each pair of guiding slots arranged along the arc of an imaginary circle, and the pairs of guiding slots arranged in sequence from one end of the main body to an opposite end of the main body;

a plurality of moveable blades connected to the main body, the moveable blades arranged in pairs spatially corresponding to the pairs of guiding slots, each of the moveable blades defining two through holes corresponding to one of guiding slots, and each moveable blade having a curvature matching the curvature of the corresponding guiding slots; and a plurality of connectors engaged in the though holes and slidably engaged in the guiding slots for holding the moveable blades to the main body, wherein each pair of the connectors is slidable along the corresponding guiding slots in unison with sliding of the corresponding moveable blade relative to the body, and each connector of the pair of the connectors is fastenable such that the connector fixes the corresponding moveable blade in position relative to the main body.

2. The compensation plate of claim 1, wherein each of the plurality of connectors includes a bolt and a nut, the bolt including a head and a post extending from the head, the post of the bolt passing through the corresponding through hole and the guiding hole and screwed into the nut to fix the corresponding moveable blade to the main body.

3. The compensation plate of claim 1, wherein each of the plurality of connectors includes a bolt including a head and a post extending from the head, and the through hole is internally threaded for fixedly receiving the post of the bolt.

4. The compensation plate of claim 1, wherein material of the main body is one of stainless steel, iron, and aluminum.

5. The compensation plate of claim 1, wherein material of each the plurality of blades is one of stainless steel, iron, and aluminum.

6. The compensation plate of claim 1, wherein each moveable blade is slidable to a position in which an outer end of the moveable blade protrudes beyond a corresponding long edge of the main body.

* * * * *